United States Patent
Quack et al.

(10) Patent No.: US 11,512,409 B2
(45) Date of Patent: Nov. 29, 2022

(54) SINGLE CRYSTALLINE DIAMOND PART PRODUCTION METHOD FOR STAND ALONE SINGLE CRYSTALLINE MECHANICAL AND OPTICAL COMPONENT PRODUCTION

(71) Applicant: ECOLE POLYTECHNIQUE FEDERALE DE LAUSANNE, Lausanne (CH)

(72) Inventors: Niels Quack, Yverdon (CH); Adrien Toros, Le Mont sur Lausanne (CH); Marcell Kiss, Chavannes-Renens (CH); Teodoro Graziosi, Renens (CH); Pascal Gallo, Yens (CH)

(73) Assignee: ECOLE POLYTECHNIQUE FEDERALE DE LAUSANNE, Lausanne (CH)

( * ) Notice: Subject to any disclaimer, the term of this patent is extended or adjusted under 35 U.S.C. 154(b) by 0 days.

(21) Appl. No.: 16/642,183

(22) PCT Filed: Aug. 30, 2017

(86) PCT No.: PCT/IB2017/055200
§ 371 (c)(1),
(2) Date: Feb. 26, 2020

(87) PCT Pub. No.: WO2019/043432
PCT Pub. Date: Mar. 7, 2019

(65) Prior Publication Data
US 2020/0199780 A1 Jun. 25, 2020

(51) Int. Cl.
*C30B 29/66* (2006.01)
*B81C 1/00* (2006.01)
(Continued)

(52) U.S. Cl.
CPC .......... *C30B 29/66* (2013.01); *B81C 1/00396* (2013.01); *B81C 1/00476* (2013.01);
(Continued)

(58) Field of Classification Search
CPC ......... C30B 29/66; C30B 29/04; C30B 33/12; C30B 29/607; B81C 1/00531;
(Continued)

(56) References Cited

U.S. PATENT DOCUMENTS 8,278,725 B2 * 10/2012 Tripathy ............. B81C 1/00484
257/414
2003/0133133 A1 7/2003 Fujiwara et al.
(Continued)

FOREIGN PATENT DOCUMENTS

EP 3 109 200 12/2016
JP 2003-207332 A 7/2003
(Continued)

OTHER PUBLICATIONS

Zhang et al. "Fabrication of Diamond Microstructures by Using Dry and Wet Etching Methods", Plasma Science and Technology, vol. 15, No. 6, Jun. 2013; pp. 552-554 (Year: 2013).*
(Continued)

*Primary Examiner* — Binh X Tran
(74) *Attorney, Agent, or Firm* — Nixon & Vanderhye P.C.

(57) ABSTRACT

The present invention relates to a free-standing single crystalline diamond part and a single crystalline diamond part production method. The method includes the steps of:
—providing a single crystalline diamond substrate or layer;
—providing a first adhesion layer on the substrate or layer;
—providing a second adhesion layer on the first adhesion layer: —providing a mask layer on the second adhesion layer; —forming at least one indentation or a plurality of indentations through the mask layer and the first and second
(Continued)

Figure 1:
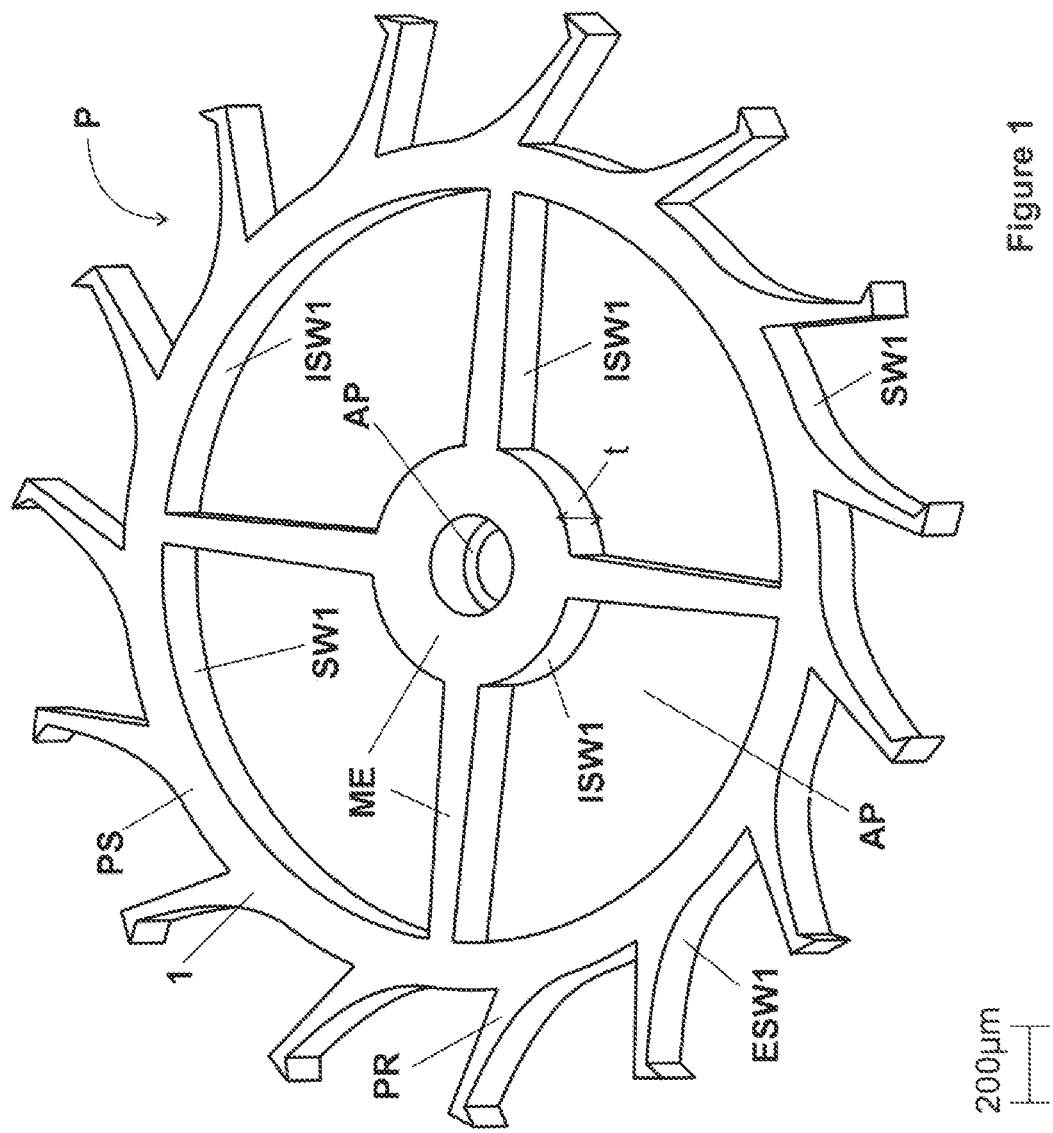

adhesion layers to expose a portion or portions of the single crystalline diamond substrate or layer; and—etching the exposed portion or portions of the single crystalline diamond substrate or layer and etching entirely through the single crystalline diamond substrate or layer.

17 Claims, 2 Drawing Sheets

(51) Int. Cl.
  *C30B 29/04* (2006.01)
  *C30B 33/12* (2006.01)
(52) U.S. Cl.
  CPC ...... *B81C 1/00531* (2013.01); *B81C 1/00539* (2013.01); *C30B 29/04* (2013.01); *C30B 33/12* (2013.01); *B81C 2201/0132* (2013.01)
(58) Field of Classification Search
  CPC ............ B81C 1/00476; B81C 1/00539; B81C 1/00396; B81C 2201/0132; B81C 1/00619; G04B 15/14; G04B 13/02; B81B 2201/035
  See application file for complete search history.

(56) References Cited

U.S. PATENT DOCUMENTS

| | | | |
|---|---|---|---|
| 2004/0129202 A1 | 7/2004 | Gruen et al. | |
| 2013/0334170 A1* | 12/2013 | Englund | C30B 33/06 216/51 |
| 2016/0052789 A1* | 2/2016 | Gaathon | H01J 37/32788 216/24 |

FOREIGN PATENT DOCUMENTS

| | | | |
|---|---|---|---|
| JP | 2012162454 A | * | 8/2012 |
| WO | 2012/118944 A2 | | 9/2012 |

OTHER PUBLICATIONS

International Search Report for PCT/IB2017/055200 dated May 29, 2018, 3 pages.
Yang et al., "Study on mask technology of CVD diamond thin films by RIE etching", Proceedings Optical Diagnostics of Living Cells II, vol. 4230, Oct. 20, 2000, pp. 218-223.
Zhang et al., "Fabrication of Diamond Microstructures by Using Dry and Wet Etching Methods", Plasma Science and Technology, Institute of Physics Publishing, vol. 15, No. 6, Jun. 25, 2013, pp. 552-554.
Ando, Yutaka, et al., "Smooth and high-rate reactive ion etching of diamond," Diamond and Related Materials, vol. 11, Nos. 3-6, 2002, pp. 824-827.
Appel, Patrick, et al., "Fabrication of all diamond scanning probes for nanoscale magnetometry," Review of Scientific Instruments, vol. 87, No. 6, 2016, pp. 063703-1-063703-9.
Enlund, Johannes, et al., "Anisotropic dry etching of boron doped single crystal CVD diamond," Carbon, vol. 43, No. 9, 2005, pp. 1839-1842.
Forsberg, Pontus, "Diamond Microfabrication for Applications in Optics and Chemical Sensing," Dissertation, Uppsala University, Mar. 8, 2013, 66 pages.
Forsberg, Pontus, et al., "High aspect ratio optical gratings in diamond," Diamond & Related Materials, vol. 34, 2013, pp. 19-24.
Fu, Jiao, et al., "Single crystal diamond cantilever for microelectromechanical systems," Diamond & Related Materials, vol. 73, 2017, pp. 267-272.
Hausmann, Birgit J. M., et al., "Fabrication of diamond nanowires for quantum information processing applications," Diamond & Related Materials, vol. 19, Nos. 5-6, 2010, pp. 621-629.
Hwang, D. S., et al., "New etching process for device fabrication using diamond," Diamond & Related Materials, vol. 13, Nos. 11-12, 2004, pp. 2207-2210.
Khanaliloo, Behzad, et al., "High-Q/V Monolithic Diamond Microdisks Fabricated with Quasi-isotropic Etching," Nano Letters, vol. 15, No. 8, 2015, pp. 5131-5136.
Lee, C. L., et al., "Etching and micro-optics fabrication in diamond using chlorine-based inductively-coupled plasma," Diamond & Related Materials, vol. 17, Nos. 7-10, 2008, pp. 1292-1296.
Liu, Hangyu, et al., "Large radius of curvature micro-lenses on single crystal diamond for application in monolithic diamond Raman lasers," Diamond & Related Materials, vol. 65, 2016, pp. 37-41.
Otterbach, R., et al., "Structures with a minimum feature size of less than 100 nm in CVD-diamond for sensor applications," Diamond and Related Materials, vol. 10, Nos. 3-7, 2001, pp. 511-514.
Otterbach, Ralf, "Tiefenätzung in Diamant am Beispiel eines Drucksensors für Hochtemperaturanwendungen," VDI Verlag, 2004, 110 pages.
Polikarpov, M., et al., "Diamond X-ray refractive lenses with high acceptance," Physics Procedia, vol. 84, 2016, pp. 213-220.
Tao, Y., et al., "Single-crystal diamond nanomechanical resonators with quality factors exceeding one million," Nature Communications, vol. 5, No. 1, 2014, 8 pages.
Tao, Y., et al., Single-Crystal Diamond Nanowire Tips for Ultrasensitive Force Microscopy, Nano Letters, vol. 15, No. 12, 2015, pp. 7893-7897.
Zhu, Tian-Fei, et al., "Fabrication of diamond microlenses by chemical reflow method," Optics Express, vol. 25, No. 2, Jan. 23, 2017, pp. 1185-1192.
Written Opinion of the International Searching Authority dated May 29, 2018, issued in International Application No. PCT/IB2017/055200, 6 pages.
Notice of Reason(s) for Rejection dated Sep. 28, 2021, issued in Japan Patent Application No. 2020-512445 and English translation, 17 pages.
Communication pursuant to Article 94(3) EPC dated Oct. 7, 2021, issued in European Application No. 17783578.2, 3 pages.
Kawakami, Nobuyuki, et al., "Microfabrication of Diamond Thin Films", R&D Kobe Steel Engineering Reports, vol. 65, No. 1, Apr. 2005, pp. 6-10.
Notice of Reason(s) for Rejection dated Mar. 8, 2022, issued in Japan Patent Application No. 2020-512445, 11 pages.

* cited by examiner

SINGLE CRYSTALLINE DIAMOND PART PRODUCTION METHOD FOR STAND ALONE SINGLE CRYSTALLINE MECHANICAL AND OPTICAL COMPONENT PRODUCTION

This application is the U.S. national phase of International Application No. PCT/IB2017/055200 filed Aug. 30, 2017 which designated the U.S., the entire contents of which are hereby incorporated by reference.

FIELD OF THE INVENTION

The present invention relates to a method for fabricating stand-alone, released components or parts in single or mono crystalline diamond and single or mono crystalline diamond parts or products produced by this method. The present invention further concerns a detached or isolated diamond part or product consisting solely of a reactive-ion-etched single crystalline diamond part or product.

DISCUSSION OF THE BACKGROUND ART

With the recent availability of industrial high purity chemical vapor deposition (CVD) single crystalline diamond, applications that take advantage of its unique optical and mechanical properties have been widely reported.

Mechanical structures such as nanomechanical resonators, nanowire tips and cantilevers have been demonstrated. In the field of optics, micro-lenses, gratings and microcavities are applications where single crystalline diamond is an ideal material.

However, applications are limited to structures with relatively small thicknesses ranging only from a few hundreds of nanometers to a few tens of microns.

Single crystalline diamond released parts up to 1.2 mm thick have been obtained by laser ablation, however, showing rough sidewalls (of about 1 µm rms), in contrast, the use of reactive ion etching (RIE) has resulted in smooth etched structures with rms roughness of a few nanometers (of about 3 nm rms). In addition, laser ablation is a sequential process, whereas plasma based methods allow for simultaneous fabrication of a multiple and an arbitrary number of parts, the only limitation being the size of the diamond substrate or a composite substrate composed of multiple individual diamond substrates.

Etching processes for single crystalline diamond have been demonstrated with oxygen-based plasmas, often found in combination with other gases such as argon or fluorocarbons (e.g. $CF_4$).

Etch rates up to 40 µm/h and selectivities to the hard mask material higher than 50:1 were reached, yet there has been no demonstration of etching depths higher than about 55 µm, however, this required the use of an external high-grade steel structure acting as a hard mask.

This limitation arises from the difficulties that are encountered during the structuration of thick hard masks used in the deep etching process, such as the formation of an edge bead during the spin coating of the photoresist on small diamond substrates. In addition, micromasking effects lead to rough surfaces and can nearly stop the etching process, thus making it difficult to reach high etching depths.

In addition, various suppliers exist for CVD diamond coatings on other materials such as silicon, and all-polycrystalline-diamond parts are commercially available. However, polycrystalline diamond has several limitations in material properties compared to single crystalline diamond.

SUMMARY

It is therefore one aspect of the present disclosure to provide a single crystalline diamond part fabrication method that overcomes the above challenges. The present invention thus relates to a method according to claim 1.

The method preferably includes the steps of:
providing a single crystalline diamond substrate or layer;
providing a first adhesion layer on the substrate or layer;
providing a second adhesion layer on the first adhesion layer;
providing a mask layer on the second adhesion layer;
forming at least one indentation or a plurality of indentations through the mask layer and the first and second adhesion layers to expose a portion or portions of the single crystalline diamond substrate or layer; and
etching the exposed portion or portions of the single crystalline diamond substrate or layer and etching entirely through the single crystalline diamond substrate or layer.

This method advantageously allows free-standing single crystalline diamond parts having larger dimensions to be produced. Moreover, the stand-alone single crystalline diamond parts have a low surface roughness. This, for example, allows synthetic single crystalline diamond mechanical working parts to be produced, for example, watch parts.

It is another aspect of the present disclosure to provide a single or mono crystalline diamond part or product produced by this method.

It is yet another aspect of the present disclosure to provide a free-standing diamond part or product consisting solely of or comprising a reactive-ion-etched synthetic single crystalline diamond.

Other advantageous features can be found in the dependent claims.

The above and other objects, features and advantages of the present invention and the manner of realizing them will become more apparent, and the invention itself will best be understood from a study of the following description with reference to the attached drawings showing some preferred embodiments of the invention.

A BRIEF DESCRIPTION OF THE DRAWINGS

Figure 2:
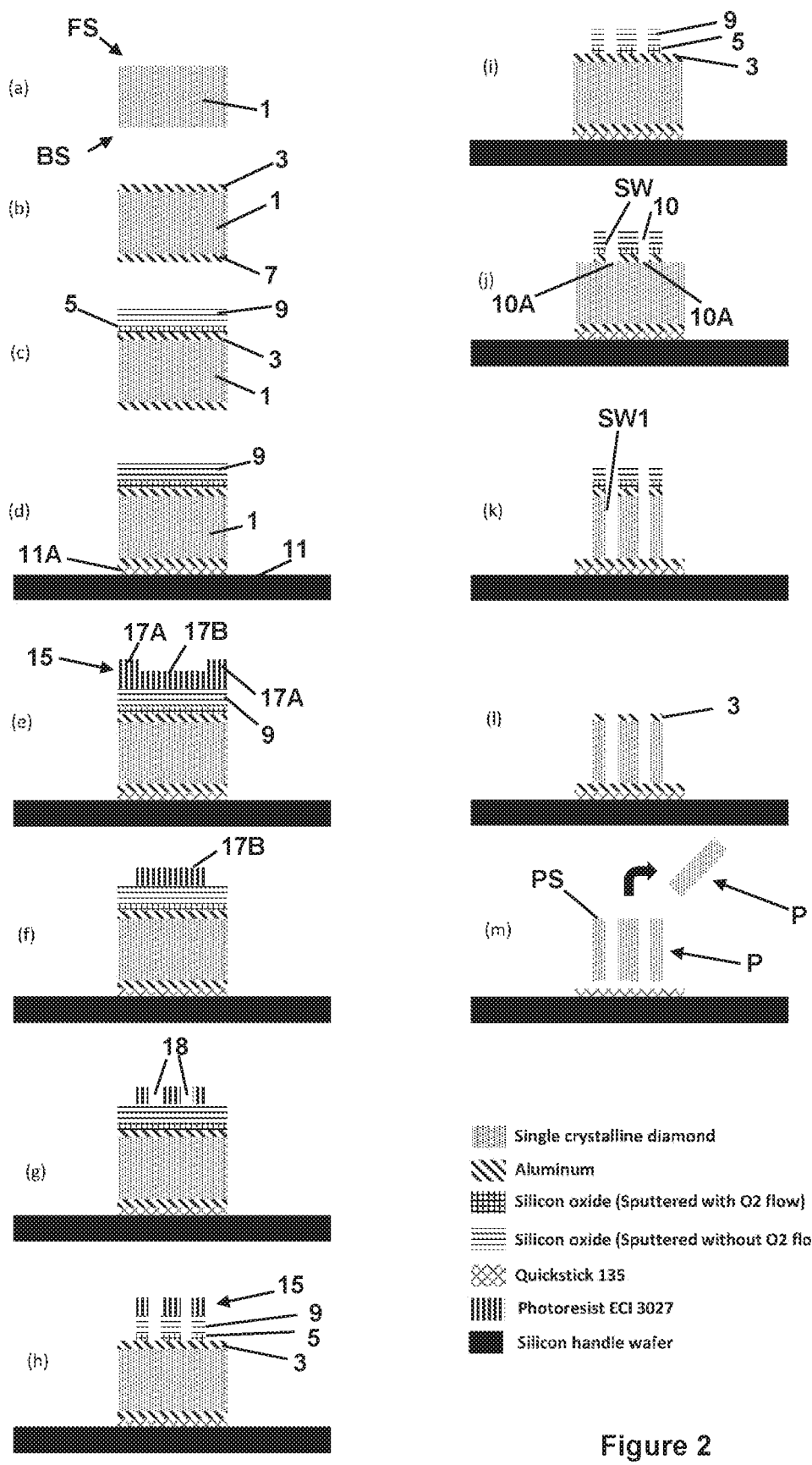

The above object, features and other advantages of the present invention will be best understood from the following detailed description in conjunction with the accompanying drawings, in which:

FIG. 1 shows an example of a released part or product in single crystalline diamond obtained with the method of the present disclosure, the released component has a diameter of (about) 3 mm, and a thickness t of (about) 0.15 mm; and FIG. 2 shows an exemplary single crystalline diamond part fabrication method as well as exemplary materials that may be used in this method.

Herein, identical reference numerals are used, where possible, to designate identical elements that are common to the Figures.

DETAILED DESCRIPTION OF SEVERAL EMBODIMENTS

FIG. 2 shows an exemplary single crystalline diamond part fabrication method and FIG. 1 shows an exemplary diamond product P produced by this method. The method of the present disclosure is, for example, for fabricating micromechanical and micro-optical components or parts in single crystalline diamond.

The process uses single or mono crystal or crystalline diamond substrates or layers 1. The single crystalline diamond substrates or layers can, for example, be of dimensions 5 mm (length (x-direction)) x5 mm (width (y-direction)) x 0.15 mm (thickness t (z-direction)). However, the method of the present disclosure is not limited to such dimensions and the single crystalline diamond substrate or layer 1 can be larger or shorter in length and width and can also have a larger or smaller thickness. For example, diamond components of thicknesses between 1 μm and 1 mm can be produced and the single crystalline diamond substrate or layer 1 thus also has a thickness between 1 μm and 1 mm. The single crystalline diamond substrate or layer 1 can alternatively have a thickness between 1 μm and 500 μm, or 50 μm and 500 μm, or 50 μm and 250 μm.

The single crystalline diamond substrate or layer 1 is preferably non-natural or synthetic single crystalline diamond, for example, chemical vapor deposition CVD single crystalline diamond or synthetic diamond by HPHT (high pressure high temperature) synthesis.

A deep reactive ion etch process is performed on the substrate or layer 1 in order to obtain released parts with arbitrary shapes (the obtained parts are "2.5 D" and not 3D, since the parts are obtained by transferring a 2D pattern in the diamond substrate by deep etching).

Unlike known methods, this process overcomes known difficulties and permits to etch completely through the diamond substrate to obtain the released parts. The process uses a thick hard mask deposition and patterning, followed by, for example, an $O_2$ based plasma etching to produce the free-standing diamond parts P (see for example FIG. 1).

A first adhesion layer 3 is deposited on or applied to the single crystalline diamond substrate or layer 1. A second adhesion layer 5 is then deposited on or applied to the first adhesion layer 3. The first adhesion layer 3 is preferably applied directly to the diamond substrate or layer 1 and the second adhesion layer 5 is preferably applied directly to the first adhesion layer 3.

The first 3 and second 5 adhesion layers comprise or consist of different materials. The first adhesion layer 3 may, for example, comprise or consist solely of aluminum, chromium or titanium or a combination of these. The second adhesion layer 5 may, for example, comprise or consist solely of silicon oxide.

The second adhesion layer 5 may, for example, comprise or consist solely of silicon oxide, $Al_2O_3$, Al, Si, SiN, Au, Ti, $Si_3N_4$, Ni, a Ni-Ti alloy, or W. The second adhesion layer 5 may also, for example, comprise or consist solely of Ag, Cu, Fe, Cr, Co, Ga, Ge, In, Mo, NiFe, NiCr, Nb, Pd, Pt, Si, Sn, Ta, or Y. The second adhesion layer 5 may also, for example, comprise or consist solely of MgO, ITO (Indium Tin Oxide, $In_2O_3$—$SnO_2$), Titanium Oxides ($TiO_2$, $Ti_2O_3$, $Ti_3O_5$), $ZrO_2$, $HfO_2$, $La_2O_3$, $Y_2O_3$ or SiC.

The first adhesion layer 3 can have, for example, a thickness of 5 nm to 250 nm. The second adhesion layer 5 can have, for example, a thickness of 5 nm to 100 nm.

A (hard) mask layer 9 is then deposited on or applied to the second adhesion layer 5. The mask layer 9 has, for example, a thickness of between 1 μm and 150 μm. The presence of the first 3 and second 5 adhesion layer assures that a mask layer 9 of significant thickness can be deposited and retained on the structure during the deep reactive ion etching of the diamond substrate or layer 1 and that etching can be carried out completely through the diamond substrate or layer 1. Delamination and cracking due to stress are prevented.

Preferably, the mask layer 9 comprises or consists solely of a material that etches (for example, in an oxygen based plasma etch) slower than the single crystalline diamond substrate or layer 1. The reactive ion etch is preferentially selective of the diamond substrate or layer 1 and preferably etches the diamond substrate or layer 1.

The mask layer 9 may, for example, comprise or consist solely of silicon oxide.

The mask layer 9 may, for example, comprise or consist solely of silicon oxide, $Al_2O_3$, Al, Si, SiN, Au, Ti, $Si_3N_4$, Ni, a Ni-Ti alloy, or W. The mask layer 9 may also, for example, comprise or consist solely of Ag, Cu, Fe, Cr, Co, Ga, Ge, In, Mo, NiFe, NiCr, Nb, Pd, Pt, Si, Sn, Ta, or Y.

The mask layer 9 may also, for example, comprise or consist solely of MgO, ITO (Indium Tin Oxide, $In_2O_3$—$SnO_2$), Titanium Oxides ($TIOS_2$, $Ti_2O_3$, $Ti_3O_5$) $ZrO_2$, $HfO_2$, $La_2O_3$, $Y_2O_3$ or SiC.

The second adhesion layer 5 and the mask layer 9 may comprise or consist solely of the same or different materials.

The first 3 and second 5 adhesion layers may also comprise or consist solely of a material that etches slower than the single crystalline diamond substrate or layer 1. The first 3 and second 5 adhesion layers may also comprise or consist solely of a material that etches slower than the mask layer 9.

At least one indentation or recess 10, or a plurality of indentations or recesses 10 are formed through the mask layer 9 and the first 3 and second 5 adhesion layers, for example by etching, to expose a portion or portions 10A of the single crystalline diamond substrate or layer 1 (see, for example, FIG. 2(j)).

The at least one indentation or the plurality of indentations 10 define a profile in the mask layer (9) and the first 3 and second 5 adhesion layers that will be transferred to the single crystalline diamond substrate or layer 1 and that defines the form or shape of the resulting single crystalline diamond part or product P.

The indentations 10 can be formed, for example, by depositing or applying a profile forming layer 15 directly on the mask layer 9 to permit the indentation or indentations 10 to be formed in the mask layer 9 as well as the first 3 and second 5 adhesion layers. The profile forming layer 15 may, for example, comprise or consist solely of a photoresist.

The deposition of the profile forming layer 15 may result in accumulation zones (or edge-beads) being formed at outer section or sections 17A of the profile forming layer 15 (see, for example, FIG. 2(e)). Such zones 17B can limit the minimum feature size achievable in the profile forming layer 15, and/or limit the accuracy of the patterns contained in the profile forming layer 15. These outer sections 17A of the profile forming layer 15 are first removed so that only a central section 17B of the profile forming layer 15 remains on the mask layer 9. The recess formation structures 18 are then formed in central section 17B (by etching for example, or by standard photolithography techniques i.e. exposure and development when the profile forming layer 15 consists of photoresist) and used to form the at least one indentation or the plurality of indentations 10 in an inner central area of the mask layer 9.

Wet-etching of sidewalls SW of the mask layer 9 defining the indentations 10 may be carried out to smoothen the sidewalk SW. This is preferably carried out prior to etching the exposed portion or portions 10A of the single crystalline diamond substrate or layer 1. The sidewalls of the second adhesion layer 5 may also be processed in the same manner.

This advantageously permits smoother sidewalls SW1 to be obtained in the single crystalline diamond substrate or layer 1.

The exposed portion or portions 10A of the single crystalline diamond substrate or layer 1 are reactive ion etched and etched entirely through the single crystalline diamond substrate or layer 1. The profile of the at least one indentation or the plurality of indentations 10 is to be transferred to the single crystalline diamond substrate or layer 1.

Etching is carried out using, for example, an oxygen based plasma etch. In addition to the oxygen based plasma etch, a physical etch may be simultaneously carried out by accelerating the plasma created ions using an applied electric field to accelerate the ions against the exposed portion or portions 10A of the single crystalline diamond substrate or layer 1. This advantageously permits a higher etch rate to be achieved.

The oxygen based plasma etch can consist solely of an oxygen based plasma. Alternatively, the plasma etch can comprise mixed gases such as oxygen and an inert gas (for example argon), or for example $O_2$ and Ar and $SF_6$; $O_2$ and $SF_6$; $O_2$ and $CF_4$; $O_2$ and $CHF_3$; or $O_2$ and $H_2$. Alternatively, a mixed gas of Ar and $Cl_2$ can be used.

The single crystalline diamond substrate or layer 1 may be attached to a support substrate 11 to allow easier handling. This can be done, for example, prior to forming the at least one indentation or plurality of indentations 10A.

The single crystalline diamond substrate or layer 1 can be attached to the support substrate 11 via a sacrificial layer 7. The support substrate 11 can be attached to the sacrificial layer 7 by an intermediate attachment layer 11A. Alternatively, the single crystalline diamond substrate or layer 1 can be attached to the support substrate 11 via only the attachment layer 11A. The attachment layer 11A may, for example, comprise an adhesive, an insulator or semiconductor or metallic layer.

The sacrificial layer 7 may comprise or consist solely of a different material or of the same material as the first adhesion layer 3.

The single crystalline diamond part or parts P can be released by removal of the sacrificial layer 7 or alternatively by removal of the attachment layer 11A, or separation at the attachment layer 11A.

A more specific exemplary embodiment will now be described in relation to FIGS. 2(a) to (m).

A cleaning step may first be carried out by cleaning a single crystalline diamond substrate or layer 1, with dimensions (about) 5 mm×5 mm×0.15 mm, using for example a Piranha solution ($H_2SO_4$(96%):$H_2O_2$(30%) (3:1)) (FIG. 2(a)).

The substrate 1 can then optionally be placed in an $O_2$ plasma (600 W, 400 sccm $O_2$ flow, 0.8 mbar) for 2 minutes in order to improve the adhesion of the first adhesion layer 3 and the sacrificial layer 7 which is for example a 200 nm thick sputtered aluminum layer deposited on both sides of the substrate or layer 1 immediately afterwards (200 W, 15 sccm Ar flow) (FIG. 2(b)).

The aluminum adhesion layer 3 on the frontside FS of the substrate 1 serves as an adhesion promoter for the subsequent deposition of a silicon oxide mask layer 9, while the sacrificial aluminum layer 7 on the backside BS serves as an etch-stop and sacrificial layer for the release of the fabricated parts P.

A 65 nm thick silicon oxide second adhesion layer 5 is sputtered on the frontside FS of the substrate 1 under $O_2$ flow (1000 W, 98 sccm Ar flow, 13 sccm $O_2$ flow), to serve as an additional adhesion layer between the first adhesion aluminum layer 3 and the 7 μm thick silicon oxide mask layer 9 sputtered subsequently without $O_2$ flow in order to achieve high deposition rates (1000 W, 15 sccm Ar flow) (FIG. 2(c)).

The substrate 1 can be glued on a silicon handling wafer 11 with for example Quickstick 135 (FIG. 2(d)), and can be followed for example by an Hexamethyldisilazane (HMDS) vapor deposition at 130° C., in order to improve the subsequently deposited photoresist 15 adhesion.

A (about) 2.5 μm thick layer of, for example, ECI 3027 photoresist is spin coated at 1750 rpm, followed by a 5 minute softbake at 100° C. (FIG. 1(e)). A substantial edge-bead 17A may be formed due to the rectangular shape of the substrate 1 and the step between the handling substrate 11 and the frontside FS of the diamond substrate or layer 1. Edge beads also form on substrates of other shapes such as circular shapes, and also form on larger substrates. It is preferably that they be removed, in order to obtain good lithography resolution (minimizing distance of mask to photoresist).

In order to remove this edge-bead 17A, a first (optical or electron beam) exposure of the photoresist 15 is done (600 mJ/cm$^2$) on the edge-bead 17A affected region (for example, from the substrate edge to (about) 0.5 mm inside the substrate 1), followed by a standard development in AZ 726 MIF developer for 137 seconds (FIG. 2(f)).

A second exposure (225 mJ/cm$^2$) is performed on the central region 17B of the substrate or layer 1, with the pattern 18 of a part or parts P to be fabricated, followed by a development in AZ 726 MIF for 108 seconds (FIG. 2(g)).

The silicon oxide second adhesion layer and mask layer 5, 9 are etched in a He/$H_2$/$C_4F_8$ based plasma in steps smaller than 4 minutes during a total time of 30 minutes and 20 seconds (FIG. 2(h)).

This is followed by the stripping of the photoresist 15, using an $O_2$ plasma (600 W, 400 sccm $O_2$ flow, 0.8 mbar) for 2 minutes, a 5 minutes immersion in a microposit remover 1165 solution heated at 75° C. followed by a deicnized (DI) water rinsing and drying under $N_2$ flow, and a second $O_2$ plasma (600 W, 400 sccm $O_2$ flow, 0.8 mbar) for 2 minutes.

In order to smoothen the sidewalls of the second adhesion layer and the mask layer, that is, the silicon oxide 5, 9 sidewalls, the substrate 1 is immersed for 15 seconds in a Buffered Hydrofluoric acid solution ($NH_4F$(40%):HF(50%) (7:1)) (FIG. 2(i)).

The first adhesion aluminum layer 3 is etched in a $Cl_2$/$BCl_3$ based plasma for (about) 1 min, immediately followed by a DI water rinsing and drying under $N_2$ flow to remove any chlorine residues (FIG. 2(j)).

The single crystalline diamond substrate 1 is etched for (about) 5 hours in an $O_2$ based plasma (2000 W ICP power, 200 W bias power, 100 sccm $O_2$ flow, 15 mTorr chamber pressure) until the aluminum backside sacrificial layer 7 is reached (FIG. 2(k)), A physical etch is simultaneously carried out via acceleration of the plasma created ions by the applied bias power. The etch rate is (about) 30 μm/hour. The RIE machine used for the diamond etch was a SPTS APS Dielectric etcher.

The adhesion and mask silicon oxide layers 5, 9 are stripped in an HF (50%) bath (FIG. 2(l)), and the first adhesion aluminum layer 3 and the (aluminum) sacrificial layer are etched in an $H_3PO_4$(85%):$CH_3COOH$(100%):$HNO_3$(70%) (83:5.5:5.5) bath at 35° C. until it is fully stripped and the parts P are released from the handling silicon wafer 11 (FIG. 2(m)).

FIG. 1 shows an exemplary example of a product P produced by this method.

Parts P obtained with this exemplary method have a sidewall angle of 84.6° ±0.5° and features down to (about) 3 µm are resolved. The sidewall SW1 roughness measured with an atomic force microscope (AFM) ranges from (about) 15 nm (rms) to (about) 200 nm (rms), depending on the region of the sidewalls (for example, the top (about) 30 µm of the sidewalls show a much smoother surface than the remaining (about) 120 µm underneath).

To the knowledge of the inventors, this is the first time that such deep etches are produced in single crystalline diamond using plasma based methods.

Moreover, as far as the inventors are aware, this is the first time that single crystalline diamond detached pieces are produced.

The method permits, for example, to produce micro-mechanical components (e.g. for the watch industry) or micro-optical parts (e.g. x-ray diffraction gratings, lenses). FIG. 1 shows an exemplary micro-mechanical component for the watch industry produced by the method of this disclosure.

Mechanical components that can be produced include, for example, a nano-indenter, mechanical testers, cutting blades, resonators. Optical components that can be produced include, for example, lenses, filters, beam splitters, windows, diffusers, prisms.

The diamond part or product P is a free-standing reactive-ion-etched synthetic single crystalline diamond part including at least one or a plurality of reactive-ion-etched sidewalls SW1. The synthetic single crystalline diamond substrate or layer can be, for example, a chemical vapor deposition (CVD) single crystalline diamond substrate or layer.

The diamond part or product P has a thickness t between 1 µm and 1 mm, and/or the at least one or the plurality of reactive-ion-etched sidewalls SW1 have a thickness t between 1 µm and 1 mm.

The diamond part or product P can consist solely of or comprise a free-standing reactive-ion-etched synthetic single crystalline diamond substrate or layer (or body) 1, and at least one or a plurality of reactive-ion-etched sidewalls SW1 to define at least one aperture AP in the substrate or layer 1, and/or at least one synthetic single crystalline diamond mechanical element ME in the substrate or layer 1, and/or at least one synthetic single crystalline diamond protrusion PR.

The synthetic single crystalline diamond protrusion PR can be for example a lateral protrusion PR. The synthetic single crystalline diamond mechanical element ME extends for example laterally in the planer direction of the substrate or layer 1.

The at least one or the plurality of reactive-ion-etched sidewalls SW1 can include at least one or a plurality of external sidewalls ESW1 defining an outer boundary of the diamond part or product P, and/or at least one or a plurality of inner sidewalls ISW1 defining inner elements of the diamond part or product P.

The at least one or the plurality of reactive-ion-etched sidewalls SW1 can be oxygen plasma etched sidewalk SW1, or can be oxygen plasma etched and physical etched sidewalk SW1, the physical etching being via acceleration of plasma created ions.

The at least one or the plurality of reactive-ion-etched sidewalls SW1 can have a RMS roughness between 1 nm and 1 µm, or a RMS roughness between 15 nm and 200 nm. The sidewalls SW1 can have a height or thickness t of between 1 µm and 1 mm, or 60 µm and 1 mm, or 150 µm and 1 mm or between 50 µm and 250 µm.

The plurality of reactive-ion-etched sidewalk can define an angle of between 84 and 90 degrees or 84 and 88 degrees with a planar surface PS of the diamond part or product.

While the invention has been disclosed with reference to certain preferred embodiments, numerous modifications, alterations, and changes to the described embodiments, and equivalents thereof, are possible without departing from the sphere and scope of the invention. Accordingly, it is intended that the invention not be limited to the described embodiments, and be given the broadest reasonable interpretation in accordance with the language of the appended claims.

REFERENCES

A. Ando, Y., Nishibayashi, Y., Kobashi, K., Hirao, T., & Oura, K. (2002), Smooth and high-rate reactive ion etching of diamond. *Diamond and Related Materials*, 11(3-6), 824-827, https://doi.org/10,1016/S0925-9635(01)00617-3

B. Appel, P., Neu, E., Ganzhorn, M., Barfuss, A., Batzer, M., Gratz, M., Maletinsky, P. (2016), Fabrication of all diamond scanning probes for nanoscale magnetometry. *Review of Scientific Instruments*, 87(6), 063703 http://doi.org/10.1063/1.4952953

C. Enlund, J., Isberg, J., Karlsson, M., Nikolajeff, F., Olsson, J., & Twitchen, D. J. (2005), Anisotropic dry etching of boron doped single crystal CVD diamond. *Carbon*, 43(9), 1839-1842. https://doi.org/10.1016/j.carbon.2005.02.022

D. Forsberg, P. (2013), Diamond Microfabrication for Applications in Optics and Chemical Sensing, Retrieved from http://www.diva-portal.org/smash/record.jsf?pid=.diva2:600078

E. Forsberg, P., & Karlsson, M. (2013), High aspect ratio optical gratings in diamond, *Diamond and Related Materials*, 34, 19-24. https://doi,org/10.1016/j,diamond.2013.01.009

F. Fu, J., Wang, F., Zhu, T., Wang, W., Liu, Z., Li, F., Hou, X. (2017), Single crystal diamond cantilever for microelectromechanical systems, *Diamond and Related Materials*, 73, 267-272. https://doi.org/10.1016/j.diamond.2016.10.011

G. Hausmann, B. J. M., Khan, M., Zhang, Y., Babinec, T. M., Martinick, K., McCutcheon, M., Lončar, M. (2010), Fabrication of diamond nanowires for quantum information processing applications, *Diamond and Related Materials*, 19(5-6), 621-629. https://doi.org/10.1016/j.diamond.2010.01.011

H. Hwang, D, S., Saito, T., & Fujimori, N. (2004); New etching process for device fabrication using diamond; *Diamond and Related Materials*, 13(11-12), 2207-2210. https://doi.org/10.1016/j.diamond.2004.07.020

I. Khanaliloo, B., Mitchell, M., Hryciw, A. C., & Barclay, P. E. (2015); High-Q/V Monolithic Diamond Microdisks Fabricated with Quasi-isotropic Etching; *Nano Letters*, 15(8), 5131-5136. https://doi.org/10.1021/acs.nanolett.5b01346

J. Lee, C. L., Gu, E., Dawson, M. D., Friel, I., & Scarsbrook, G. A. (2008); Etching and micro-optics fabrication in diamond using chlorine-based inductively-coupled plasma; *Diamond and Related Materials*, 17(7-10), 1292-4296. https://doi,org/10.1016/j.diamond.2008.01.011

K. Liu H., Reilly, S., Herrnsdorf, J., Xie, E., Savitski, V. G., Kemp, A. J., Dawson, M. D. (2016); Large radius of curvature micro-lenses on single crystal diamond for application in monolithic diamond Raman lasers; *Diamond and Related Materials*, 65, 37-41. https://doi.org/10.1016/j.diamond.2016.01.016

L. Otterbach, R., Hilleringmann, U., Horstmann, T. J., & Goser, K. (2001); Structures with a minimum feature size of less than 100 nm in CVD-diamond for sensor applications; *Diamond and Related Materials*, 10(3), 511-514.

M. Otterbach, Ralf. (2004). *Tiefenätzung in Diamant am Beispiel eines Drucksensors für Hochtemperaturanwendungen* (Vol. Nr. 1023). Düsseldorf: VDI Verlag.

N. Polikarpov, M., Polikarpov, V., Snigireva, I., & Snigirev, A. (2016); Diamond X-ray Refractive Lenses with High Acceptance; *Physics Procedia*, 84, 213-220. https://doi.org/10.1016/j.phpro.2016.11.037

O. Tao, Y., Boss, J. M., Moores, B. A., & Degen, C. L. (2014); Single-crystal diamond nanomechanical resonators with quality factors exceeding one million; *Nature Communications*, 5. https://doi.org/10.1038/ncomms4638

P. Tao, Y., & Degen, C. L. (2015); Single-Crystal Diamond Nanowire Tips for Ultrasensitive Force Microscopy; *Nano Letters*, 15(12), 7893-7897. https://doi.org/10.1021/acs.nanolett.5b02885

Q. Zhu, T. F., Fu, J., Wang, W., Wen, F., Zhang, J., Bu, R., Wang, H. X. (2017); Fabrication of diamond microlenses by chemical reflow method. *Optics Express*, 25(2), 1185; https://doi.org/10.1364/OE.25.001185

The invention claimed is:

1. Single crystalline diamond part production method including the steps of:
   providing a single crystalline diamond substrate or layer;
   providing a first adhesion layer on the single crystalline diamond substrate or layer;
   providing a second adhesion layer on the first adhesion layer;
   providing a mask layer on the second adhesion layer;
   forming at least one indentation or a plurality of indentations through the mask layer and the first and second adhesion layers to expose a portion or portions of the single crystalline diamond substrate or layer;
   etching the exposed portion or portions of the single crystalline diamond substrate or layer by exposing the indentation in the mask layer and the first and second adhesion layers as well as the exposed portion or portions of the single crystalline diamond substrate or layer to plasma etching and etching entirely through the single crystalline diamond substrate or layer; wherein the etching of the exposed portion or portions of the single crystalline diamond substrate or layer is carried out using plasma etching and using physical etching via acceleration of plasma created ions against the exposed portion or portions of the single crystalline diamond substrate or layer; and
   releasing a free-standing single crystalline diamond part, so that the single crystalline diamond part is completely detached from any surrounding material or support material.

2. Method according to claim 1, wherein the first adhesion layer is provided directly on a surface of the single crystalline diamond substrate or layer.

3. Method according to claim 1, wherein the second adhesion layer is provided directly on the first adhesion layer.

4. Method according to claim 1, wherein the first and second adhesion layers comprise or consist of different materials.

5. Method according to claim 1, wherein the mask layer and/or the first adhesion layer and/or the second adhesion layer comprises or consists solely of a material that etches slower than single crystalline diamond.

6. Method according to claim 1, wherein the mask layer and/or the first adhesion layer and/or the second adhesion layer comprises or consists solely of a material that etches slower than single crystalline diamond exposed to an oxygen based plasma etch.

7. Method according to claim 1, wherein the single crystalline diamond substrate or layer is etched entirely through a thickness of between 1 µm and 1 mm.

8. Method according to claim 1, wherein the produced single crystalline diamond part has a thickness between 1 µm and 1 mm.

9. Method according to claim 1, wherein the etching of the exposed portion or portions of the single crystalline diamond substrate or layer is carried out using an oxygen based plasma etch.

10. Method according to claim 1, wherein the etching of the exposed portion or portions of the single crystalline diamond substrate or layer is carried out using an oxygen based plasma etch and physical etching via acceleration of plasma created ions against the exposed portion or portions of the single crystalline diamond substrate or layer.

11. Method according to claim 1, wherein the at least one indentation or the plurality of indentations define a single crystalline diamond part profile in the mask layer that is to be transferred to the single crystalline diamond substrate or layer.

12. Method according to claim 1, further including the step of providing a sacrificial layer on the single crystalline diamond substrate or layer wherein the sacrificial layer comprises or consists solely of the same material as the first adhesion layer.

13. Method according to claim 1, wherein the single crystalline diamond substrate or layer is attached to a substrate, or the method further includes the step of attaching the single crystalline diamond substrate or layer to a support prior to forming the at least one indentation or plurality of indentations.

14. Method according to claim 1, further including the step of wet-etching sidewalls of the mask layer defining the at least one indentation or the plurality of indentations to smoothen the sidewalls prior to etching the exposed portion or portions of the single crystalline diamond substrate or layer.

15. Method according to claim 1, wherein the single crystalline diamond part is released by removal of a sacrificial layer or removal of an attachment layer of the single crystalline diamond substrate or layer to a substrate.

16. Method according to claim 1, further including the step of providing a profile forming layer on the mask layer for forming the at least one indentation or the plurality of indentations in the mask layer.

17. Method according to the previous claim 16, further including the step of removing outer sections of the profile forming layer so that a central section of the profile forming layer remains on the mask layer for forming the at least one indentation or the plurality of indentations in an inner area of the mask layer.

* * * * *